United States Patent
Xu et al.

(10) Patent No.: US 10,628,651 B2
(45) Date of Patent: Apr. 21, 2020

(54) CAPACITIVE FINGERPRINT SENSOR

(71) Applicant: Microarray Microelectronics Corp., LTD, Jiangsu (CN)

(72) Inventors: Kefeng Xu, Jiangsu (CN); Yangyuan Li, Jiangsu (CN)

(73) Assignee: MICROARRAY MICROELECTRONICS CORP., LTD, Suzhou, Jiangsu (CN)

( * ) Notice: Subject to any disclaimer, the term of this patent is extended or adjusted under 35 U.S.C. 154(b) by 82 days.

(21) Appl. No.: 15/779,871

(22) PCT Filed: Nov. 30, 2016

(86) PCT No.: PCT/CN2016/108037
§ 371 (c)(1),
(2) Date: May 30, 2018

(87) PCT Pub. No.: WO2017/092676
PCT Pub. Date: Jun. 8, 2017

(65) Prior Publication Data
US 2019/0005291 A1     Jan. 3, 2019

(30) Foreign Application Priority Data

Dec. 2, 2015 (CN) .......................... 2015 1 0874861

(51) Int. Cl.
*G06K 9/20*     (2006.01)
*G06K 9/00*     (2006.01)
*H03K 17/96*     (2006.01)

(52) U.S. Cl.
CPC ............ *G06K 9/0002* (2013.01); *G06K 9/00* (2013.01); *H03K 17/962* (2013.01); *H03K 2017/9604* (2013.01)

(58) Field of Classification Search
CPC ............ G06K 9/0002; G06K 9/00006–9/0012
See application file for complete search history.

(56) References Cited

U.S. PATENT DOCUMENTS

2011/0163768 A1    7/2011   Kwon
2013/0315451 A1*   11/2013   Franza ................. G06K 9/0002
                                             382/124
(Continued)

FOREIGN PATENT DOCUMENTS

CN     102954753     3/2013
CN     103149450     6/2013
(Continued)

OTHER PUBLICATIONS

Internation Search Report for Corresponding Application# PCT /CN2016/108037; dated Feb. 17, 2017.

*Primary Examiner* — Brian Werner
(74) *Attorney, Agent, or Firm* — Niels Haun; Dann, Dorfman, Herrell & Skillman, P.C.

(57) ABSTRACT

The present invention provides a capacitive fingerprint sensor which images fingerprints by measuring differences between coupling capacitance formed between ridge lines of the fingerprints and corresponding units on planar sensing electrode arrays and that formed between valley lines of the fingerprints and corresponding units on the planar sensing electrode arrays. A conventional "C-Q-T" type capacitive fingerprint sensor employs twice conversion from capacitance to charge quantity and then to integrating time to indirectly measure the capacitance; and the capacitance-charge quantity conversion efficiency can be improved by coupling a human body with a driving signal so as to improve the sensitiveness of the sensor. According to the improved "C-Q-T" type capacitive fingerprint sensor provided coupling a ground potential of the fingerprint sensor with a reversed-phase driving signal equivalently substitutes for coupling the driving signal to the human body, so that the sensitiveness of the sensor is further enhanced.

11 Claims, 5 Drawing Sheets

(56) References Cited

U.S. PATENT DOCUMENTS

2016/0078269 A1* 3/2016 Thornblom ........ G06K 9/00053
           382/124
2016/0307019 A1* 10/2016 Zhang .................. G06K 9/0002
2016/0364595 A1* 12/2016 Du ....................... G06K 9/0002

FOREIGN PATENT DOCUMENTS

| CN | 103714330 | 4/2014 |
| CN | 103902123 | 7/2014 |
| CN | 104880635 | 9/2015 |
| CN | 105046194 | 11/2015 |
| CN | 105335737 | 2/2016 |

* cited by examiner

From Sensor Power Supply Domain to System Ground Power Supply Domain

FIG. 10a

From System Ground Power Supply Domain to Sensor Power Supply Domain

FIG. 10b

CAPACITIVE FINGERPRINT SENSOR

RELATED APPLICATIONS

The present application is a 371 of International Application No. PCT/CN2016/108037, filed Nov. 30, 2016, which claims priority of the Chinese patent application No. 201510874861.7, filed on Dec. 2, 2015 and entitled as "Capacitive Fingerprint Sensor", which applications are incorporated herein by reference in their entirety.

FIELD OF THE INVENTION

The present invention relates to a capacitive fingerprint sensor.

BACKGROUND OF THE INVENTION

Based on the Chinese patent "Capacitive Fingerprint Sensor" with the application number of 201210403271.2, in the technical solution of the capacitive fingerprint sensor provided by the Chinese patent "Capacitive Fingerprint Sensor" with the application number of 201410004072.3, a sensing equation and a circuit model are optimized to provide a novel circuit structure so as to realize "C-Q-T" conversion.

The capacitive fingerprint sensor images fingerprints by measuring differences between the coupling capacitance formed between ridge lines of fingerprints and planar sensing electrode array units and that formed between valley lines of the fingerprints and the planar sensing electrode array units. When a dielectric layer between a sensing electrode array and a finger becomes thicker, the capacitance may decay and images of the sensor will be increasingly blurred. With technological development, the thickness of a dielectric layer between a sensing electrode and a target electrode of a commercial capacitive fingerprint sensor increases from an order of magnitude of 10 μm to an order of magnitude of 100 μm. Furthermore, taking into account the integrity of industrial design of a mobile phone screen, it is expected that the fingerprint sensor can directly penetrate through screen glass, particularly chemically strengthened glass with the thickness of 400 μm to 500 μm. So, improving the imaging capability of the fingerprint sensor as much as possible becomes an important indicator for measuring the performance of the fingerprint sensor at present.

To improve imaging of a "C-Q-T" type fingerprint sensor, a driving signal can be coupled between the finger and the fingerprint sensor, and the amplitude of the driving signal can be increased to enhance a measured signal to further enhance fingerprint imaging. One of two common driving modes is to directly couple the finger with the driving signal, and the other is to couple a power supply end or a ground end of the fingerprint sensor with the driving signal. The two driving modes can equivalently enhance the fingerprint imaging capability when using theoretical models. However, in practical application, it is difficult to model accurately due to relatively complicated electrical characteristics of the finger. Besides, different individuals have different electrical characteristics under different temperatures and humidity, so that the design of the method for directly coupling the finger with driving is inconvenient. On one hand, the frequency of the driving signal for driving the finger should not be too high, since the driving signal with the relatively high frequency may lead to an amplitude gradient when transmitted on the surface of the finger to result in inconsistent amplitude of the driving signal on the surface of the finger, which probably causes field inconsistency in fingerprint imaging. On the other hand, the amplitude of the driving signal applied to the finger should not be too high, either. If the peak-peak value of the driving signal exceeds 4 V, discomfort may be caused to a human body.

SUMMARY OF THE INVENTION

Objectives of the present invention are to apply a mode of coupling a ground end of a fingerprint sensor with a driving signal to a "C-Q-T" type capacitive fingerprint sensor and to ensure that the sensor benefits from the driving mode and imaging of the fingerprint sensor is enhanced accordingly.

In order to achieve one of the above objectives, one embodiment of the present invention provides a capacitive fingerprint sensor, comprising a sensor ground generator, a sensing unit, a charge accumulation unit and a comparison circuit.

In order to achieve one of the above objectives, one embodiment of the present invention provides an operating method of a capacitive fingerprint sensor, and the capacitive fingerprint sensor is operated according to the following time sequence: step 1: reset a charge accumulation unit; step 2: set a first level control signal to high; step 3: close an initialization switch; step 4: enable a ground end SGND of a fingerprint sensor to output a ground level; step 5: set the first level control signal to low; step 6: open the initialization switch; step 7: enable the ground end SGND of the fingerprint sensor to output a high-voltage level; step 8: close a row selection switch; step 9: open the row selection switch; and step 10: return to step 2.

Compared with the prior art, the capacitive fingerprint sensor and the operating method thereof, provided by the embodiments of the present invention, have the following beneficial effects: the above shortcomings can be well overcome by a method for coupling a power supply end or a ground end of the fingerprint sensor with a driving signal. On one hand, when coupled with the power supply end or the ground end of the fingerprint end, the driving signal neither directly acts on a finger nor brings discomfort to a human body, so the amplitude of the driving signal is not limited. On the other hand, the driving mode ensures that potentials of the power supply end and the ground end of the fingerprint sensor change along with variation of the driving signal, so there is no field inconsistency in fingerprint imaging. Furthermore, since it is unnecessary to couple the finger with the driving signal in the driving mode, industrial design of the surface of a mobile phone may not be changed. For example, for the design that the fingerprint sensor is arranged below a cover plate of the mobile phone, the only requirement is to mount the fingerprint sensor below the cover plate of the mobile phone, without destroying the integrity of the cover plate.

DETAILED DESCRIPTION OF THE EMBODIMENTS

A fingerprint sensor provided by the present invention mainly comprises a sensing unit, a charge accumulation unit, a comparison circuit and a sensor ground generator. The sensor ground generator has a first input end connected with an input power supply VIN, a ground end connected with a system ground GND, and an output end connected with a ground end SGND of the fingerprint sensor. An output end of the sensing unit is connected with an input end of the charge accumulation unit. The charge accumulation unit has the input end connected with the output end of the sensing unit, and an output end connected with an input end of the comparison circuit. The comparison circuit has the input end connected with the output end of the charge accumulation unit, and an output end which is an output of the fingerprint sensor.

The sensor ground generator comprises an inductor, a diode, a first switch, a second switch and a third switch. The first switch has a first port connected with an input end of the sensor ground generator, and a second port connected with a first port of the inductor. The second switch has a first port connected with a first port of the diode, and a second port connected with a ground level. The third switch has a first port connected with the output end of the sensor ground generator, and a second port connected with the ground level. The inductor has the first port connected with the second port of the first switch, and a second port connected with the first port of the diode. The diode has the first port connected with the first port of the second switch, and a second port connected with the output end of the sensor ground generator.

When adopting the above structure, the sensor ground generator is operated according to the following time sequence: step 1-1: open the first switch, close the second switch, close the third switch, and enable the output end of the sensor ground generator to output the ground level; step 1-2: close the first switch, close the second switch, close the third switch, and enable the output end of the sensor ground generator to output the ground level; step 1-3: close the first switch, open the second switch, open the third switch, and enable the output end of the sensor ground generator to output an inductance-determined non-ground level; and step 1-4: return to step 1-2.

As a further improved technical solution of the present invention, the sensor ground generator comprises a power supply circuit, a fifth switch and a sixth switch. The power supply circuit has an input end connected with an input end of the sensor ground generator, and an output end connected with a first port of the fifth switch. The fifth switch has the first port connected with an output end of the power supply circuit, and a second port connected with an output end of the sensor ground generator. The sixth switch has a first port connected with the output end of the sensor ground generator, and a second port connected with a ground level.

When adopting the above structure, the sensor ground generator is operated according to the following time sequence: step 2-1, open the fifth switch, close the sixth switch and enable the output end of the sensor ground generator to output the ground level; step 2-2, close the fifth switch, open the sixth switch, and enable the output end of the sensor ground generator to output a non-ground level; and step 3, return to step 2-1.

In the sensing unit, a sensing electrode comprises one or more electrodes and is connected with a first port of an initialization switch and a first port of a row selection switch. A target electrode is a surface of a target to be measured, is connected with a first level driver and is positioned above the sensing electrode, wherein a dielectric layer is arranged between the target electrode and the sensing electrode, and a target capacitance is formed between the target electrode and the sensing electrode. A driving electrode comprises one or more electrodes, is connected with the first level driver and is positioned below the sensing electrode, wherein a dielectric layer is arranged between the driving electrode and the sensing electrode, and a driving capacitance is formed between the driving electrode and the sensing electrode. The first level driver has a control end connected with a first level control signal, and an output end connected with the driving electrode. The first level driver outputs a level V11 to the driving electrode when the first level control signal is low, and outputs a level V12 to the driving electrode when the first level control signal is high.

The row selection switch has the first port connected with the sensing electrode, and a second port connected with the output end of the sensing unit. The initialization switch has a first port connected with the sensing electrode, and a second port connected with a first reference voltage. The first reference voltage is connected with the second port of the initialization switch.

The charge accumulation unit comprises a second reference voltage, a first reset switch and a first integrating capacitor. The second reference voltage is connected with a first port of the first reset switch. The first reset switch has the first port connected with the second reference voltage, and a second port connected with an output end of the charge accumulation unit. The first integrating capacitor has a first port connected with the output end of the charge accumulation unit, and a second port connected with a ground end of the fingerprint sensor.

When adopting the above structure, the charge accumulation unit is reset according to the following time sequence: step 3-1: close the first reset switch; and step 3-2: open the first reset switch.

As a further improved technical solution of the present invention, the charge accumulation unit comprises a third reference voltage, a second reset switch, a first amplifier and a second integrating capacitor. The first amplifier has a first input end connected with an input end of the charge accumulation unit, a second input end connected with the third reference voltage, and an output end connected with an output end of the charge accumulation unit. The second integrating capacitor has a first port connected with the first input end of the first amplifier, and a second port connected with the output end of the first amplifier. The second reset switch has a first port connected with the first input end of the first amplifier, and a second port connected with the output end of the first amplifier. The third reference voltage is connected with the second input end of the first amplifier.

When adopting the above structure, the charge accumulation unit is reset according to the following time sequence: step 4-1: close the second reset switch; and step 4-2: open the second reset switch.

Furthermore, the charge accumulation unit comprises a fourth reference voltage, a third reset switch, a fourth reset switch, a second amplifier, a follow-up switch and a third integrating capacitor. The second amplifier has a first input end connected with a second port of the third reset switch, a second input end connected with the fifth reference voltage, and an output end connected with an output end of the charge accumulation unit. The third reset switch has a first port connected with the fifth reference voltage, and a second port connected with the first input end of the second amplifier. The fourth reset switch has a first port connected with the fourth reference voltage, and a second port connected with a second port of the third integrating capacitor. The follow-up switch has a first port connected with the second port of the third integrating capacitor, and a second port connected with the output end of the second amplifier. The third integrating capacitor has a first port connected with the first input end of the second amplifier, and the second port connected with a second port of the fourth reset switch. The fourth reference voltage is connected with a first port of the fourth reset switch. The fifth reference voltage is connected with the first port of the third reset switch.

When adopting the above structure, the charge accumulation unit is reset according to the following time sequence: step 5-1: close the follow-up switch; step 5-2: close the third reset switch and close the fourth reset switch; step 5-3: open the third reset switch and open the fourth reset switch; and step 5-4: open the follow-up switch.

The comparison circuit comprises a comparator and a sixth reference voltage. The comparator has a first input end connected with an input end of the comparison circuit, a second input end connected with the sixth reference voltage, and an output end connected with an output end of the comparison circuit. The sixth reference voltage is connected with a second input end of the comparator.

The present invention provides a "C-Q-T" type fingerprint sensor which enhances fingerprint imaging by coupling a ground end of the fingerprint sensor with a driving signal.

Particularly, a coupling capacitance (equivalent to the target capacitance) is formed between a measured fingerprint surface (equivalent to the target electrode) and a capacitance measuring plate (equivalent to the sensing electrode). Different distances between different fields of the measured fingerprint surface and different capacitance measuring plate units of corresponding sensor arrays lead to different target capacitances. In addition, the coupling capacitance formed between the driving electrode and the sensing electrode is a driving capacitance; and the coupling capacitance formed between the sensing electrode and the power supply end of the fingerprint sensor or that between the sensing electrode and the ground end of the fingerprint sensor is a background capacitance.

The integrating capacitor is charged to the second reference voltage (also referring to the third reference voltage or the fifth reference voltage in the description) first, charge transfer is periodically performed on the integrating capacitor and the target capacitance, and the transferred charge quantity is related to the sensing unit, the charge accumulation unit and a bus parasitic capacitor. As for a determined design of the fingerprint sensor, the rates of charge transfer between different target capacitances and different integrating capacitors are different. This is called a "C-Q" process.

The charge quantity in the integrating capacitor may increasingly vary unidirectionally in the "C-Q" process. When the variation curve of voltage at the output end of the charge accumulation unit passes through the sixth reference voltage, the output of the comparison circuit may be reversed; and the reverse time point of the comparison circuit represents the output of the fingerprint sensor. This is called a "Q-T" process.

Therefore, the sensing process of the sensor is "determining a difference between the target capacitances, determining a difference of charge transfer rates of the integrating capacitors, and determining a reverse time of the comparison circuit", namely, a "C-Q-T" process.

The value of the target capacitance is set as $C_f$, the value of the driving capacitance is set as $C_d$, the capacitance of a parasitic capacitor in the sensing unit is set as $C_b$, the capacitance of the bus parasitic capacitor is set as $C_p$, the value of the first reference voltage is set as VREF1, the value of the second reference voltage is set as VREF2, the value of the sixth reference voltage is set as VREF6, and the high-voltage level output by the output end of the sensor ground generator is set as VH. Meanwhile, it is defined that: $\Delta V1 = V12 - V11$, $\Delta V2 = V22 - V21$, and $\Delta VREF = VREF2 - VREF1$. It should be noted that a bus capacitor may be deemed to only add an additional capacitance onto the integrating capacitor, so $C_p$ is no longer separately listed in the following computational analysis. The capacitance of a finger of the human body is much more than the coupling capacitance between the fingerprint sensor and the finger. It is believed that the level of the finger is invariable, so the target electrode is approximately grounded during computational analysis.

The control logic time sequence of the "C-Q" process is as below: step 1: reset the charge accumulation unit; step 2: set the first level control signal to high; step 3: close the initialization switch; step 4: enable the ground end SGND of the fingerprint sensor to output the ground level; step 5: set the first level control signal to low; step 6: open the initialization switch; step 7: enable the ground end SGND of the fingerprint sensor to output the high-voltage level; step 8: close the row selection switch; step 9: open the row selection switch; and step 10: return to step 2.

In step 1, the integrating capacitor is reset. After that, the integrating capacitor has the voltage VOUT.rst=VREF2.

After n times of charge transfer, the following equation holds between the voltage VOUT(n) of the integrating capacitor and the previous voltage VOUT(n−1) of the integrating capacitor according to the charge balance principle:

$$VOUT(n-1)*Cr + VREF1*(Cb+Cd+Cf) - V11*Cd = -VH*Cf + VOUT(n)*(Cr+Cb+Cd+Cf) - V12*Cd,$$

which is $$\text{transformed to be: } VOUT(n) = [VOUT(n-1)*Cr + VREF1*(Cb+Cd+Cf) - \Delta V1*Cd + VH*Cf]/(Cr+Cb+Cd+Cf) \quad (1).$$

$$\text{Therefore, } \Delta VOUT = VOUT(n) - VOUT(n-1) = [(VREF1 - VOUT(n-1))*(Cb+Cd+Cf) - \Delta V1*Cd + VH*Cf]/(Cr+Cb+Cd+Cf)\Delta VOUT'(Cf) \quad (2)$$

$$= [(VREF1 - VOUT(n-1))*Cr + VH*(Cr+Cd+Cb) + \Delta V1*Cd]/(Cr+Cb+Cd+Cf)^2 \quad (3).$$

The "Q-T" process is in fact a process that charge quantity in the integrating capacitor increasingly varies unidirectionally. When the variation curve of the output voltage VOUT of the integrating capacitors passes through the sixth reference voltage, the output of the comparison circuit may be reversed; and the reverse time point of the comparison circuit represents the output of the fingerprint sensor. It can be seen from the formula (3) that the variation curves of both of the different target capacitances $C_f$ and the output voltages VOUT of different integrating capacitors are of unidirectional variation, so the reverse time point of the comparison circuit is also of unidirectional variation. In the formula (3), VH*(Cr+Cd+Cb) can increase the variation rate of the output voltages VOUT of the integrating capacitors relative to the target capacitances Cf, and the variation rate of the reverse time point of the comparison circuit relative to the target capacitances Cf will also be increased, which enhances fingerprint imaging. Besides, the higher the output high voltage VH of the sensor ground generator is, the stronger the fingerprint imaging becomes.

Hereinafter, the present invention will be further described with reference to specific embodiments. In addition, repeated reference numbers or marks may be used in different embodiments. These repetitions are only for the sake of simplicity and clarity in describing the present invention and do not represent any correlation between the different embodiments and/or structures discussed.

Figure 1:
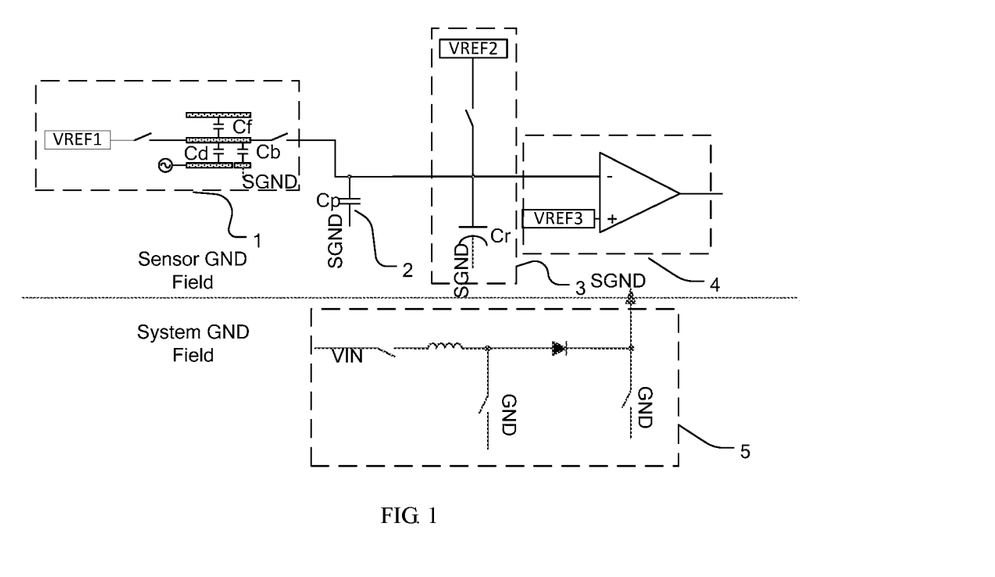
FIG. 1 is a schematic view of a capacitive fingerprint sensor.

FIG. 1 is the schematic view of a capacitive fingerprint sensor. As shown in FIG. 1, the fingerprint sensor provided by the present invention mainly comprises a sensing unit 1, a charge accumulation unit 3, a comparison circuit 4, a sensor ground generator 5 and a bus capacitor 2, wherein the sensing unit 1 is generally arranged in groups.

An output end of the sensing unit 1 is connected with an input end of the charge accumulation unit 3; the charge accumulation unit 3 has the input end connected with the output end of the sensing unit 1, and an output end connected with an input end of the comparison circuit 4. The comparison circuit 4 has the input end connected with the output end of the charge accumulation unit 3, and an output end which is an output of the fingerprint sensor. The sensor ground generator 5 has a first input end connected with an input power supply VIN, a ground end connected with a system ground GND, and an output end connected with a ground end SGND of the fingerprint sensor. In addition, the bus capacitor 2 is located between the output end of the sensing unit 1 and the ground end SGND of the fingerprint sensor.

Figure 2:
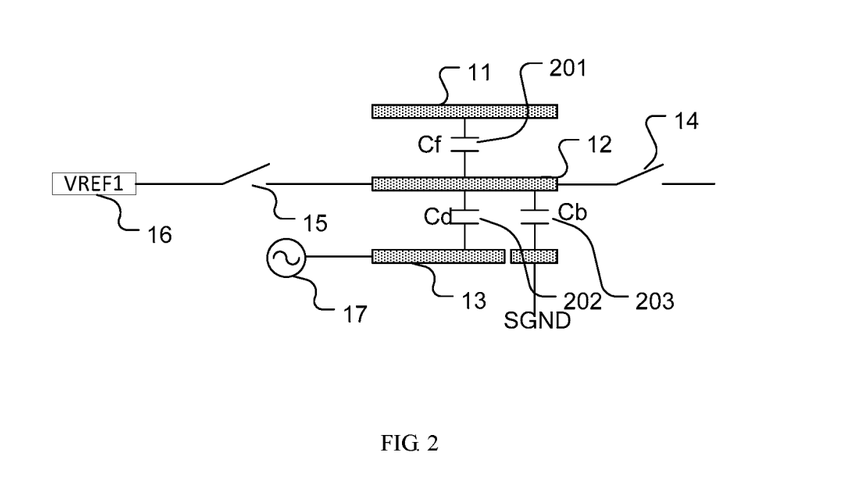
FIG. 2 is a schematic view of a sensing unit.

FIG. 2 is the schematic view of a sensing unit. As shown in FIG. 2, the sensing unit 1 comprises a target electrode 11, a sensing electrode 12, a driving electrode 13, a first level driver 17, a row selection switch 14, an initialization switch 15 and a first reference voltage 16.

The sensing electrode 12 comprises one or more electrodes, and is connected with a first port of the initialization switch 15 and a first port of the row selection switch 14. The target electrode 11 is a surface of a target to be measured and is positioned above the sensing electrode 12, wherein a dielectric layer is arranged between the target electrode 11 and the sensing electrode 12, and a target capacitance 201 is formed between the target electrode 11 and the sensing electrode 12. The driving electrode 13 comprises one or more electrodes, is connected with the first level driver 17 and is positioned below the sensing electrode 12, wherein a dielectric layer is arranged between the driving electrode 13 and the sensing electrode 12, and a driving capacitance 202 is formed between the driving electrode 13 and the sensing electrode 12.

The first level driver 17 is connected with the driving electrode 13. The initialization switch 15 has a first port connected with the sensing electrode 12, and a second port connected with the first reference voltage 16. The row selection switch 14 has a first port connected with the sensing electrode 12, and a second port connected with the output end of the sensing unit 1. In addition, a background capacitor 203 is further arranged in the sensing unit 1.

Figure 3:
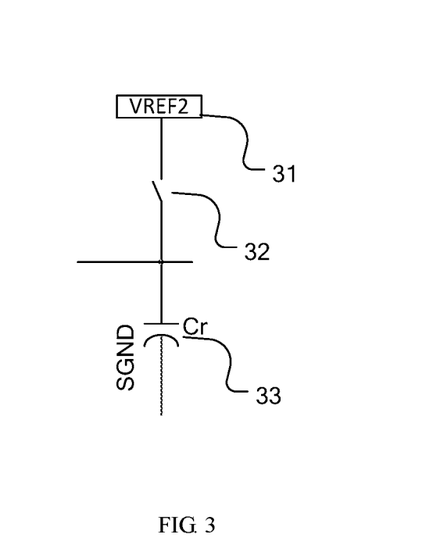
FIG. 3 shows a first embodiment of a charge accumulation unit.

FIG. 3 is the first embodiment of a charge accumulation unit. As shown in FIG. 3, the charge accumulation unit 3 comprises a first reset switch 32, a first integrating capacitor 33 and a second reference voltage 31.

The second reference voltage 31 is connected with a first port of the first reset switch 32. The first reset switch 32 has the first port connected with the second reference voltage 31, and a second port connected with an output end of the charge accumulation unit 3. The first integrating capacitor 33 has a first port connected with the output end of the charge accumulation unit 3, and a second port connected with a ground end SGND of the fingerprint sensor.

In this embodiment, the charge accumulation unit 3 is reset according to the following time sequence: step 1: close the first reset switch 32; and step 2: open the first reset switch 32.

Figure 4:
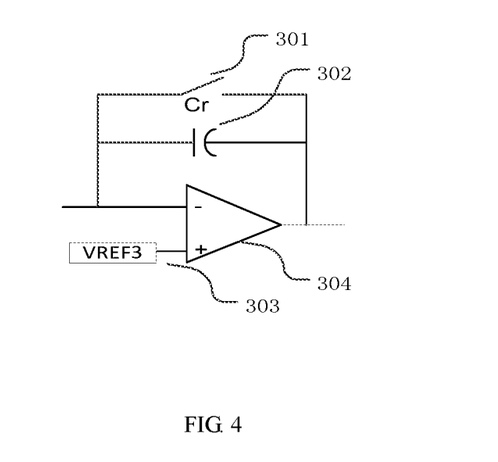
FIG. 4 shows a second embodiment of the charge accumulation unit.

FIG. 4 is the second embodiment of the charge accumulation unit. As shown in FIG. 4, the charge accumulation unit 3 comprises a second reset switch 301, a second integrating capacitor 302, a third reference voltage 303 and a first amplifier 304.

The first amplifier 304 has a first input end connected with an input end of the charge accumulation unit 3, a second input end connected with the third reference voltage 303, and an output end connected with an output end of the charge accumulation unit 3. The second integrating capacitor 302 has a first port connected with the first input end of the first amplifier 304, and a second port connected with the output end of the first amplifier 304. The second reset switch 301 has a first port connected with the first input end of the first amplifier 304, and a second port connected with the output end of the first amplifier 304.

In this embodiment, the charge accumulation unit 3 is reset according to the following time sequence: step 1: close the second reset switch 301; and step 2: open the second reset switch 301.

Figure 5:
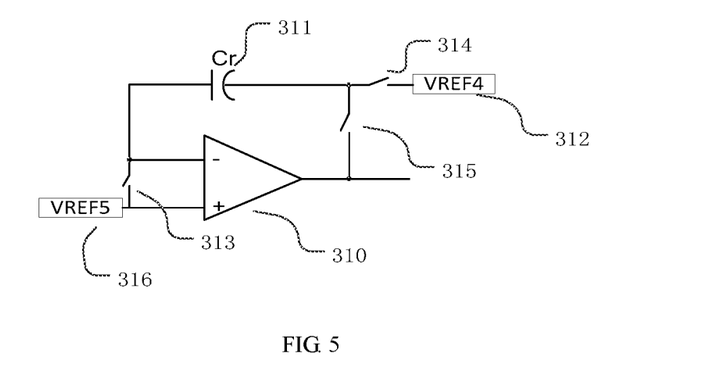
FIG. 5 shows a third embodiment of the charge accumulation unit.

FIG. 5 is the third embodiment of the charge accumulation unit. As shown in FIG. 5, the charge accumulation unit 3 comprises a second amplifier 310, a third integrating capacitor 311, a fourth reference voltage 312, a third reset switch 313, a fourth reset switch 314, a follow-up switch 315 and a fifth reference voltage 316.

The fourth reset switch 314 has a first port connected with the fourth reference voltage 312, and a second port connected with a second port of the third integrating capacitor 311. The third reset switch 313 has a first port connected with a first port of the third integrating capacitor 311, and a second port connected with the fifth reference voltage 316. The third integrating capacitor 311 has the first port connected with a first input end of the second amplifier 310, and a second port connected with the first port of the fourth reset switch 314. The follow-up switch 315 has a first port connected with the second port of the third integrating capacitor 311, and a second port connected with an output end of the charge accumulation unit 3. The second amplifier 310 has a first input end connected with an input end of the charge accumulation unit 3, a second input end connected with the fifth reference voltage 316, and an output end connected with the output end of the charge accumulation unit 3. The fourth reference voltage 312 is connected with the second port of the fourth reset switch 314. The fifth reference voltage 316 is connected with the second port of the third reset switch 313.

In this embodiment, the charge accumulation unit 3 is reset according to the following time sequence: step 1: open the follow-up switch 315; step 2: close the third reset switch 313 and close the fourth reset switch 314; step 3: open the third reset switch 313 and open the fourth reset switch 314; and step 4: close the follow-up switch 315.

Figure 6:
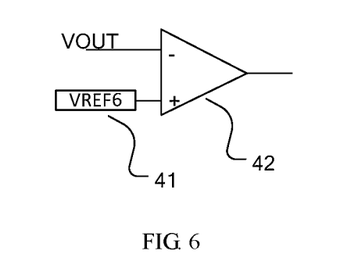
FIG. 6 is a schematic view of the comparison circuit.

FIG. 6 is the circuit diagram of a comparison circuit of the present invention. As shown in FIG. 6, the comparison circuit 4 comprises a comparator 42 and a sixth reference voltage 41.

The comparator 42 has a first input end connected with an input end of the comparison circuit 4, a second input end connected with the sixth reference voltage 41, and an output end connected with an output end of the comparison circuit 4. The sixth reference voltage 41 is connected with the second input end of the comparator 42.

Figure 7:
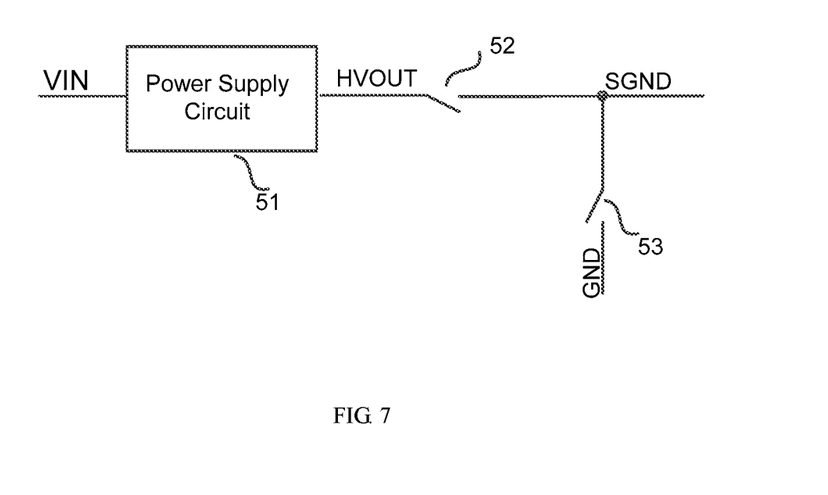
FIG. 7 shows a first embodiment of a sensor ground generator.

FIG. 7 is the first embodiment of a sensor ground generator. As shown in FIG. 7, the sensor ground generator 5 comprises a power supply circuit 51, a first switch 52 and a second switch 53.

The power supply circuit 51 has an input end connected with an input power supply VIN, and an output end connected with a first port of the first switch 52. The first switch 52 has a first port connected with the output end of the power supply circuit 51, and a second port connected with the output end of the sensor ground generator 5. The second switch 53 has a first port connected with the output end SGND of the sensor ground generator 5, and a second port connected with a ground level GND.

In the first embodiment, the sensor ground generator is operated according to the following time sequence: step 1: open the first switch 52, close the second switch 53, and enable the output end of the sensor ground generator 5 to output the ground level; step 2: close the first switch 52, open the second switch 53, and enable the output end of the sensor ground generator 5 to output a non-ground level; and step 3: return to step 1.

The power supply circuit 51 may adopt some mature circuit structures, for example, common technological means including a charge pump, a switching power supply, etc., which will not be repeated herein.

Figure 8:
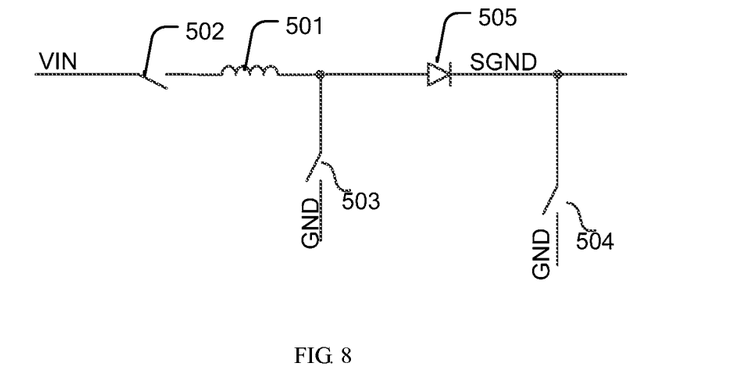
FIG. 8 shows a second embodiment of the sensor ground generator.

FIG. 8 is the second embodiment of the sensor ground generator. As shown in FIG. 8, the sensor ground generator 5 is an inductive circuit and comprises an inductor 501, a third switch 502, a fourth switch 503, a fifth switch 504 and a diode 505.

The inductor 501 has a first port connected with a second port of the third switch 502, and a second port connected with a first port of the diode 505. The third switch 502 has a first port connected with an input power supply VIN, and a second port connected with the first port of the inductor 501. The fourth switch 503 has a first port connected with the first port of the diode 505, and a second port connected with a ground level GND. The fifth switch 504 has a first port connected with the output end of the sensor ground generator 5, and a second port connected with the ground level GND. The diode 505 has the first port connected with the first port of the fourth switch 503, and a second port connected with the output end of the sensor ground generator 5.

In the second embodiment, the sensor ground generator is operated according to the following time sequence: step 1: open the third switch 502, close the fourth switch 503, close the fifth switch 504, and enable the output end of the sensor ground generator 5 to output the ground level; step 2: close the third switch 502, close the fourth switch 503, close the fifth switch 504, and enable the output end of the sensor ground generator 5 to output the ground level; step 3: close the third switch 502, open the fourth switch 503, open the fifth switch 504, and enable the output end of the sensor ground generator 5 to output an inductance-determined non-ground level; and step 4: return to step 2.

Figure 9:
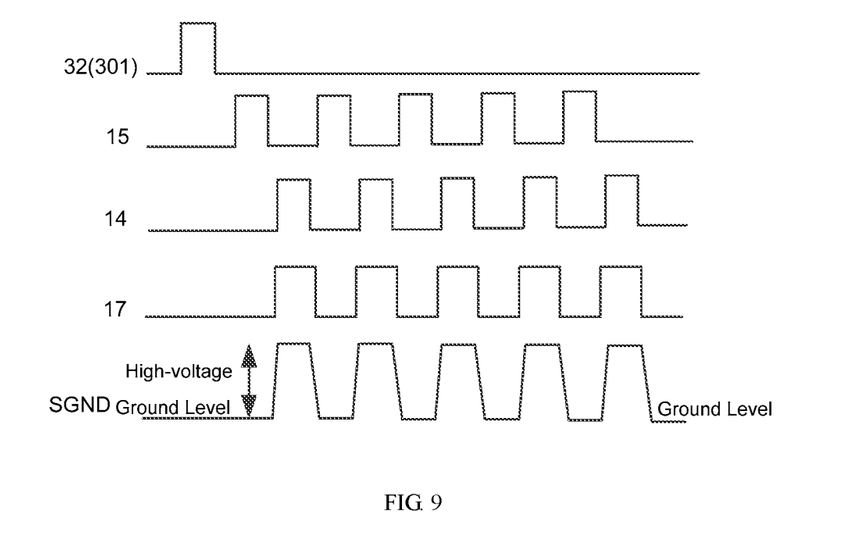
FIG. 9 is an operating time sequence diagram of the fingerprint sensor.

FIG. 9 shows the operation waveform of the capacitive fingerprint sensor. As shown in FIG. 9, the operation process of the capacitive fingerprint sensor is as below: step 1: reset the charge accumulation unit 3; step 2: set the first level control signal to high; step 3: close the initialization switch 15; step 4: enable the ground end SGND of the fingerprint sensor to output the ground level; step 5: set the first level control signal to low; step 6: open the initialization switch 15; step 7: enable the ground end SGND of the fingerprint sensor to output a high-voltage level; step 8: close the row selection switch 14; step 9: open the row selection switch 14; and step 10: return to step 2.

Figure 10A:
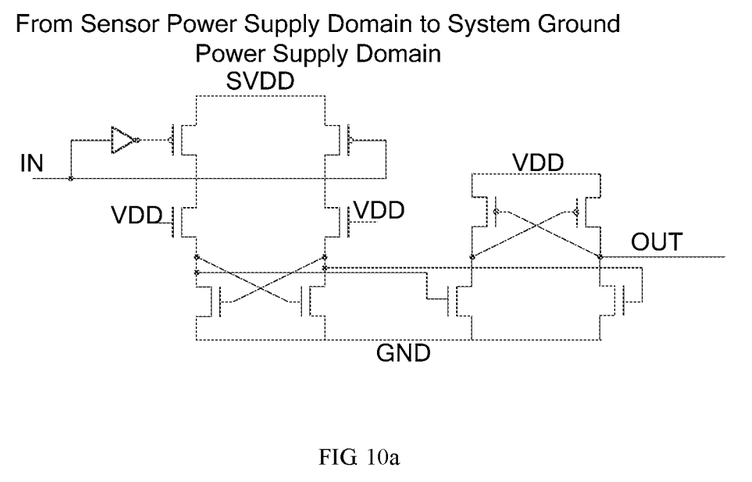
FIGS. 10a-10b are operating principle diagrams of a level shifter.
Figure 10B:
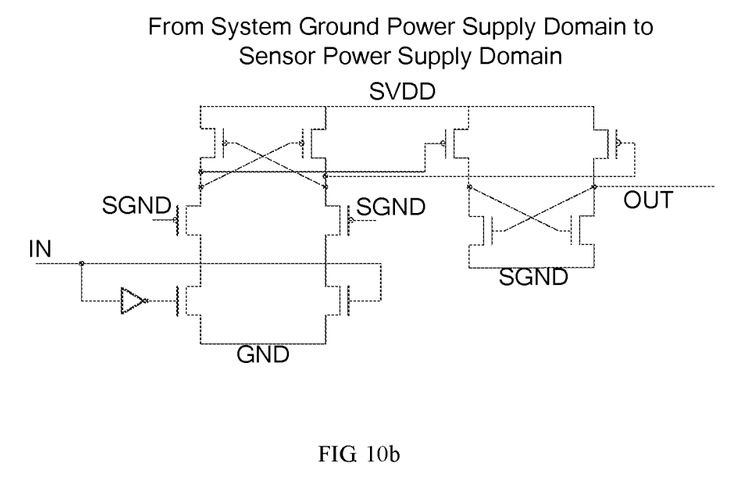

FIGS. 10*a*-10*b* are operating principle diagrams of a level shifter. The capacitive fingerprint sensor disclosed by the present invention has two power supply domains. In the prior art, signal communication is generally realized between the two power supply domains through the level shifter. FIG. 10*a* shows the general circuit structure of the level shifter when a signal is transmitted from a sensor power supply domain to a system ground power supply domain. FIG. 10*b* shows the general circuit structure of the level shifter when the signal is transmitted from the system ground power supply domain to the sensor power supply domain. Here, the specific structure of the level shifter belongs to the prior art, and will not be repeated herein.

The present invention is elaborated by but not limited to the embodiments disclosed above, and various amendments and changes made in accordance with the essence of the present invention should fall within the scope of the claims of this present invention.

What is claimed is:

1. A capacitive fingerprint sensor, comprising: a sensor ground generator,
   a sensing unit, a charge accumulation unit and a comparison circuit, wherein
   the sensor ground generator comprises an inductor, a first switch, a second switch, a third switch and a diode;
   the sensing unit comprises a target electrode, a sensing electrode, a driving electrode, a level driver, a row selection switch, an initialization switch and a first reference voltage;
   the charge accumulation unit comprises a second reference voltage, a first reset switch and a first integrating capacitor; and
   the comparison circuit comprises a comparator and a sixth reference voltage.

2. The capacitive fingerprint sensor of claim 1, wherein
   the sensor ground generator has a first input end connected with an input power supply VIN, a ground end connected with a system ground GND, and an output end connected with a ground end SGND of the fingerprint sensor;
   an output end of the sensing unit is connected with an input end of the charge accumulation unit;
   the charge accumulation unit has the input end connected with the output end of the sensing unit, and an output end connected with an input end of the comparison circuit; and
   the comparison circuit has the input end connected with the output end of the charge accumulation unit, and an output end which is an output of the fingerprint sensor.

3. The capacitive fingerprint sensor of claim 1, wherein
   the first switch of the sensor ground generator has a first port connected with an input end of the sensor ground generator, and a second port connected with a first port of the inductor;

the second switch has a first port connected with a first port of the diode, and a second port connected with a ground level;

the third switch has a first port connected with the output end of the sensor ground generator, and a second port connected with the ground level;

the inductor has the first port connected with the second port of the first switch, and a second port connected with the first port of the diode; and the diode has the first port connected with the first port of the second switch, and a second port connected with the output end of the sensor ground generator.

4. The capacitive fingerprint sensor of claim 1, wherein the sensing electrode of the sensing unit comprises one or more electrodes and is connected with a first port of the initialization switch and a first port of the row selection switch;

the target electrode is a surface of a target to be measured and is positioned above the sensing electrode, wherein a dielectric layer is arranged between the target electrode and the sensing electrode, and a target capacitance is formed between the target electrode and the sensing electrode;

the driving electrode comprises one or more electrodes, is connected with the level driver and is positioned below the sensing electrode, wherein a dielectric layer is arranged between the driving electrode and the sensing electrode, and a driving capacitance is formed between the driving electrode and the sensing electrode;

the level driver is connected with the driving electrode;

the initialization switch has a first port connected with the sensing electrode, and a second port connected with the first reference voltage; and the row selection switch has a first port connected with the sensing electrode, and a second port connected with the output end of the sensing unit.

5. The capacitive fingerprint sensor of claim 1, wherein the second reference voltage of the charge accumulation unit is connected with a first port of the first reset switch;

the first reset switch has the first port connected with the second reference voltage, and a second port connected with the output end of the charge accumulation unit; and the first integrating capacitor has a first port connected with the output end of the charge accumulation unit, and a second port connected with the ground end of the fingerprint sensor.

6. The capacitive fingerprint sensor of claim 1, wherein the charge accumulation unit comprises a first amplifier, a third reference voltage, a second reset switch and a second integrating capacitor, wherein the first amplifier has a first input end connected with an input end of the charge accumulation unit, a second input end connected with the third reference voltage, and an output end connected with an output end of the charge accumulation unit;

the second integrating capacitor has a first port connected with the first input end of the first amplifier, and a second port connected with the output end of the first amplifier;

the second reset switch has a first port connected with a first input end of the first amplifier, a second port connected with the output end of the first amplifier; and the third reference voltage is connected with a second input end of the first amplifier.

7. The capacitive fingerprint sensor of claim 1, wherein the charge accumulation unit comprises a second amplifier, a fourth reference voltage, a fifth reference voltage, a third reset switch, a fourth reset switch, a follow-up switch and a third integrating capacitor, wherein the second amplifier has a first input end connected with a second port of the third reset switch, a second input end connected with the fifth reference voltage, and an output end connected with an output end of the charge accumulation unit;

the third reset switch has a first port connected with the fifth reference voltage, and a second port connected with a first input end of the second amplifier;

the fourth reset switch has a first port connected with the fourth reference voltage, and a second port connected with a second port of the third integrating capacitor;

the follow-up switch has a first port connected with a second port of the third integrating capacitor, and a second port connected with an output end of the second amplifier;

the third integrating capacitor has a first port connected with the first input end of the second amplifier, and the second port connected with the second port of the fourth reset switch;

the fourth reference voltage is connected with a first port of the fourth reset switch; and the fifth reference voltage is connected with the first port of the third reset switch.

8. The capacitive fingerprint sensor of claim 1, wherein the comparator of the comparison circuit has a first input end connected with an input end of the comparison circuit, a second input end connected with the sixth reference voltage, and an output end connected with an output end of the comparison circuit; and the sixth reference voltage is connected with a second input end of the comparator.

9. The capacitive fingerprint sensor of claim 1, further comprising a control circuit configured to generate a timing control signal, wherein the control circuit comprises a level shifter configured to realize level conversion of the signal between a power supply domain of the fingerprint sensor and a power supply domain of the system ground.

10. A capacitive fingerprint sensor, comprising: a sensor ground generator, a sensing unit, a charge accumulation unit and a comparison circuit, wherein the sensor ground generator comprises a power supply circuit, a fifth switch and a sixth switch;

the power supply circuit has an input end connected with an input power supply (VIN), and an output end connected with a first port of the fifth switch;

the fifth switch has the first port connected with the output end of the power supply circuit, and a second port connected with an output end (SGND) of the sensor ground generator; and the sixth switch has a first port connected with the output end (SGND) of the sensor ground generator, and a second port connected with a ground level (GND).

11. An operating method of a capacitive fingerprint sensor, wherein the capacitive fingerprint sensor is operated according to the following time sequence:

step 1, resetting a charge accumulation unit;

step 2, setting a first level control signal to high;

step 3, closing an initialization switch;

step 4, enabling a ground end SGND of the fingerprint sensor to output a ground level;

step 5, setting the first level control signal to low;

step 6, opening the initialization switch;

step 7, enabling the ground end SGND of the fingerprint sensor to output a high-voltage level;
step 8, closing a row selection switch;
step 9, opening the row selection switch; and
step 10, returning to step 2.

\* \* \* \* \*